(12) United States Patent
Kang

(10) Patent No.: US 7,214,969 B2
(45) Date of Patent: May 8, 2007

(54) WAVELENGTH-CONVERTIBLE LIGHT EMITTING DEVICE

(75) Inventor: Hyoung Dong Kang, Kyungki-do (KR)

(73) Assignee: Samsung Electro-Mechanics Co. Ltd., Suwon, Kyungki-Do (KR)

( * ) Notice: Subject to any disclaimer, the term of this patent is extended or adjusted under 35 U.S.C. 154(b) by 0 days.

(21) Appl. No.: 11/301,665

(22) Filed: Dec. 13, 2005

(65) Prior Publication Data

US 2006/0192208 A1    Aug. 31, 2006

(30) Foreign Application Priority Data

Feb. 28, 2005    (KR)  ............... 10-2005-0016518

(51) Int. Cl.
*H01L 29/22* (2006.01)

(52) U.S. Cl. ............... 257/98; 257/99; 257/94; 257/415

(58) Field of Classification Search ............ 257/98, 257/99, 100, 94, 415, 417; 331/155, 73
See application file for complete search history.

(56) References Cited

U.S. PATENT DOCUMENTS 4,991,150 A *   2/1991   Wixom ................. 367/140
5,446,334 A *   8/1995   Gaffney ................ 310/338

* cited by examiner

*Primary Examiner*—Sara Crane
(74) *Attorney, Agent, or Firm*—Volpe and Koenig P.C.

(57) ABSTRACT

The present invention provides a wavelength-convertible LED which has first and second surfaces, including first and second conductivity-type cladding layers and an active layer formed between the first and second conductivity-type cladding layers to emit a specific wavelength light. The invention also includes at least a piezoelectric layer on at least one of the first and second surfaces of the semiconductor LED with its thickness variable according to the applied voltage, and a rigid frame made of substantially non-resilient rigid material surrounding the semiconductor LED and the at least one piezoelectric layer such that the increase of the thickness of the piezoelectric layer is applied to the semiconductor LED as pressure. The invention further includes a plurality of terminals on the rigid frame, connected to the first and second conductivity-type cladding layers, and the piezoelectric layer.

10 Claims, 3 Drawing Sheets

WAVELENGTH-CONVERTIBLE LIGHT EMITTING DEVICE

CLAIM OF PRIORITY

This application claims the benefit of Korean Patent Application No. 2005-16518 filed on Feb. 28, 2005, in the Korean Intellectual Property Office, the disclosure of which is incorporated herein by reference.

BACKGROUND OF THE INVENTION

1. Field of the Invention

The present invention relates to a wavelength-convertible light emitting device, and more particularly, to a wavelength-convertible light emitting device which allows adjustment of energy band gap of semiconductor Light Emitting Diode (LED) to vary the wavelength of emitted light in a single complete semiconductor LED.

2. Description of the Related Art

In general, semiconductor Light Emitting Diode (LED) has merits including superior monochromatic peak wavelength and light efficiency, and feasibility of miniaturization, which makes it popular as diverse light sources for display devices.

Display devices require light sources of variety of colors. However, a peculiar wavelength of light is determined in a semiconductor LED mainly by the energy band gap of the constituting material (especially, active area). Thus, in order to obtain light having a wavelength different from the peculiar one, the constituting material of the semiconductor LED needs to be changed. For example, Al and/or In can be changed to increase or decrease the energy band gap in a GaN-based semiconductor.

Alternatively, the peculiar wavelength of the LED determined by the constituting material may be converted into a desired wavelength of light with use of fluorescent material. This type of LED is manufactured by applying and hardening specific fluorescent paste on the light emission region of the LED. The wavelength of this type of LED is determined by a constant factor such as fluorescent film, which is used mainly for obtaining white light.

As described above, a single LED emits a fixed, specific wavelength light only. Therefore, in order to achieve variety of colors, a compound of different colors of LEDs, i.e., a plurality of semiconductor LEDs emitting red (R), green (G), and blue (B) have been combined and used. However, this technique not only requires a complicated driving circuit, but also is subject to inevitable loss due to mixing of colors.

Therefore, a more desirable alternative would be techniques capable of changing the wavelength of light of a single, complete product of LED, in accordance with specific conditions. But, as described above, since the wavelength of the LED is inherently determined by the energy band gap (and the characteristics of fluorescent film) of the constituting material, there has not been a disclosure of techniques for adjusting the wavelength light in a single, complete product of LED, to date.

SUMMARY OF THE INVENTION

The present invention has been made to solve the foregoing problems of the prior art and it is therefore an object of the present invention to provide a wavelength-convertible Light Emitting Diode (LED) in which the energy band gap of an active layer is adjusted using the pressure applied to the semiconductor LED to vary the wavelength of light.

In order to realize the above described object, the present invention provides a wavelength-convertible light emitting device including: a semiconductor LED having first and second surfaces opposed to each other, and the LED including first and second conductivity-type cladding layers and an active layer formed between the first and second conductivity-type cladding layers to emit a specific wavelength light; at least a piezoelectric layer disposed on at least one of the first and second surfaces of the semiconductor LED, with its thickness variable according to the applied voltage; a rigid frame made of substantially non-resilient rigid material, surrounding the semiconductor LED and the at least a piezoelectric layer such that the increase of the thickness of the piezoelectric layer is applied to the semiconductor LED as pressure; and a plurality of terminals formed on the rigid frame, connected to the first and second conductivity-type cladding layers and the piezoelectric layer, respectively.

In order to obtain sufficient pressure, the at least a piezoelectric layer may comprise first and second piezoelectric layers disposed on the first and second surfaces of the semiconductor LED, respectively.

Specifically, the semiconductor LED contains at least one semiconductor material selected from a group including GaP, GaAs, GaAsP, InGaP, AlGaInP, GaAs, AlGaAs, GaN, InGaN, AlGaN, and AlGaInN.

The energy band gap tends to increase with the increase in applied pressure. Therefore, in order to achieve variety of colors, it is preferable that the active area of the semiconductor LED emits light having a wavelength of about 500 nm to about 800 nm when no pressure is applied from the piezoelectric layer.

In addition, it is preferable that the maximum pressure applied to the semiconductor LED from the piezoelectric layer is from about 100 Kbar to about 300 Kbar. In a typical semiconductor material, the pressure has to be at least 100 Kbar to induce sufficient change in the energy band gap, whereas if pressure is 300 Kbar or more, the rigid frame may not be mechanically stable. The pressure can be adjusted within this maximum pressure range to achieve variety of wavelength light.

In the preferred embodiment of the present invention, the semiconductor LED may further include a conductive substrate with a first conductivity-type cladding layer, an active layer, and a second conductivity-type cladding layer formed in their order thereon. The first and second surfaces of the semiconductor LED may be an underside of the conductive substrate and an upper surface of the second conductivity-type cladding layer, respectively.

In another embodiment in which at least one piezoelectric layer is disposed on either one surface of the LED, the plurality of terminals include a common terminal connected to a surface of the piezoelectric layer and to either one of the first and second surfaces of the semiconductor LED in contact with the piezoelectric layer, a piezoelectric material driving terminal connected to the other surface of the piezoelectric layer, and an LED-driving terminal connected to the other one of the first and second surfaces of the semiconductor LED.

In the preferred embodiment of the present invention, in which the piezoelectric layer consists of the first and second piezoelectric layers disposed on the first and second surfaces of the semiconductor LED, respectively, a plurality of terminals may include: a first piezoelectric-material-driving terminal connected to an underside of the piezoelectric layer positioned on the first surface of the LED; a second piezoelectric layer-driving terminal connected to an upper surface of the piezoelectric layer positioned on the second surface of the LED; a first common terminal connecting the first surface of the LED with the piezoelectric layer contacting the first surface; and a second common terminal connecting the second surface of the LED with the piezoelectric layer contacting the second surface of the LED.

Preferably, the rigid frame may be a structure with at least one side opened up to expose a side of the active layer.

In addition, in case of the rigid frame necessarily covering a large area of the LED for the structural stability, the rigid frame may be made of transparent material so as not to undermine the light emission efficiency.

The present invention is based on the principle in which high pressure is applied to a single LED using piezoelectric material to induce the conversion of the lattice constant of the active layer, thereby increasing the energy band gap. The present invention is capable of changing the peculiar wavelength of light of a single complete product of LED according to the applied voltage. Also, when used in a display device, simple adjustment of applied voltage allows achievement of variety of colors with faster switching speed, without a plurality of LEDs and complex driving circuit needed for achieving variety of colors.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 1:
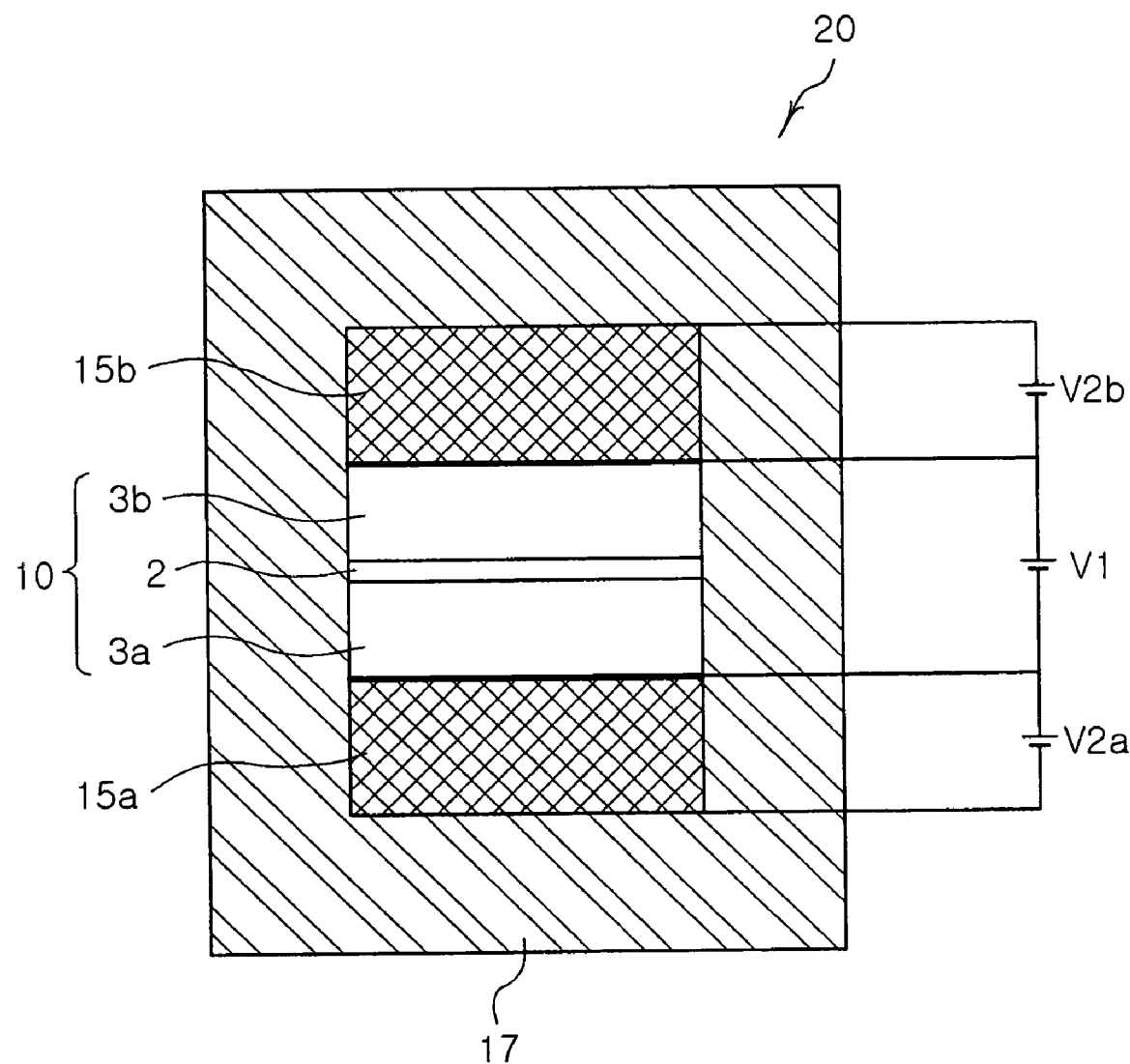
FIG. 1 is an overall view illustrating a wavelength-convertible light emitting device according to the present invention.

FIG. 1 is an overall view of a wavelength-convertible light emitting device according to the present invention. This diagram shows overall constitution in order to more clearly explain the driving principle of the light emitting device of the present invention, with some elements not shown but explained briefly.

Referring to FIG. 1, the wavelength-convertible light emitting device 20 broadly includes a semiconductor light emitting diode 10, first and second piezoelectric layers 15a and 15b, and a rigid frame 17.

The semiconductor LED 10 includes first and second conductivity-type cladding layers 3a and 3b, and an active layer 2 formed therebetween. Each layer of the LED 10 may be formed of typical semiconductor material such as group II-V semiconductor or group III-IV semiconductor, and preferably, of at least one semiconductor material selected from a group including GaP, GaAs, GaAsP, InGaP, AlGaInP, GaAs, AlGaAs, GaN, InGaN, AlGaN, and AlGaInN.

In the preferred embodiment of the present invention, first and second piezoelectric layers 15a and 15b are disposed on both sides of the LED opposed to each other, and used as means to apply high pressure on the active layer 2 of the LED 10 to change the lattice constant, thereby increasing or decreasing the energy band gap.

Preferably, in order to simplify the structure of power connection through common terminal, the first and second piezoelectric layers 15a and 15b are disposed on the underside of the first conductivity-type cladding layer 3a and the upper surface of the second conductivity-type cladding layer 3b, respectively. The first and second piezoelectric layers 15a and 15b may be made of material capable of changing its thickness (or volume) according to applied power. Such material includes piezoelectric material such as crystal, titanate barium, and titanate zirconate.

The rigid frame 17 integrally surrounds the first and second piezoelectric layers 15a and 15b, and the LED 10 interposed therebetween, and is made of substantially non-resilient rigid material. Therefore, the change in the thickness of the first and second piezoelectric layers 15a and 15b may function as a source of pressure applied to the LED 10. In addition, since pressure capable of changing the energy band gap of the active layer 2 is of hundreds of Kbar, it is preferable to select material which can maintain mechanical stability at such high pressure.

The rigid frame 17 is formed in a structure and/or material appropriate for emitting light from the active layer 2. That is, as shown in the embodiment, when a side-emission type LED is used, the rigid frame 17 may have a structure in which at least one side (or both sides opposed to each other) is opened up to expose a corresponding side of the active layer. The rigid frame may also be formed of transparent material. In case of covering a large area of the LED for structural stability, the rigid frame 17 may be formed of transparent material so as not to undermine the light emission efficiency.

In the structure of the light emitting device shown in FIG. 1, the first and second piezoelectric layers 15a ad 15b have power sources V1, V2a, and V2b driven independently from the LED. The power source V1 connected to the LED 10 provides substantially fixed driving voltage, but the power sources V2a and V2b connected to the first and second piezoelectric layers 15a and 15b provide variable driving voltage in order to adjust pressure being applied.

As explained above, the present invention has a feature that pressure of the piezoelectric layer variable in accordance with the driving voltage is used to adjust the energy band gap of the active layer, thereby changing the peculiar light wavelength of the LED.

In the preferred embodiment of the invention, the first and second piezoelectric layers are disposed on both sides of the LED, respectively, to apply higher pressure to the active layer, but it is also possible to consider disposing at least one piezoelectric layer on either one of the first and second surfaces of the LED.

Figure 2:
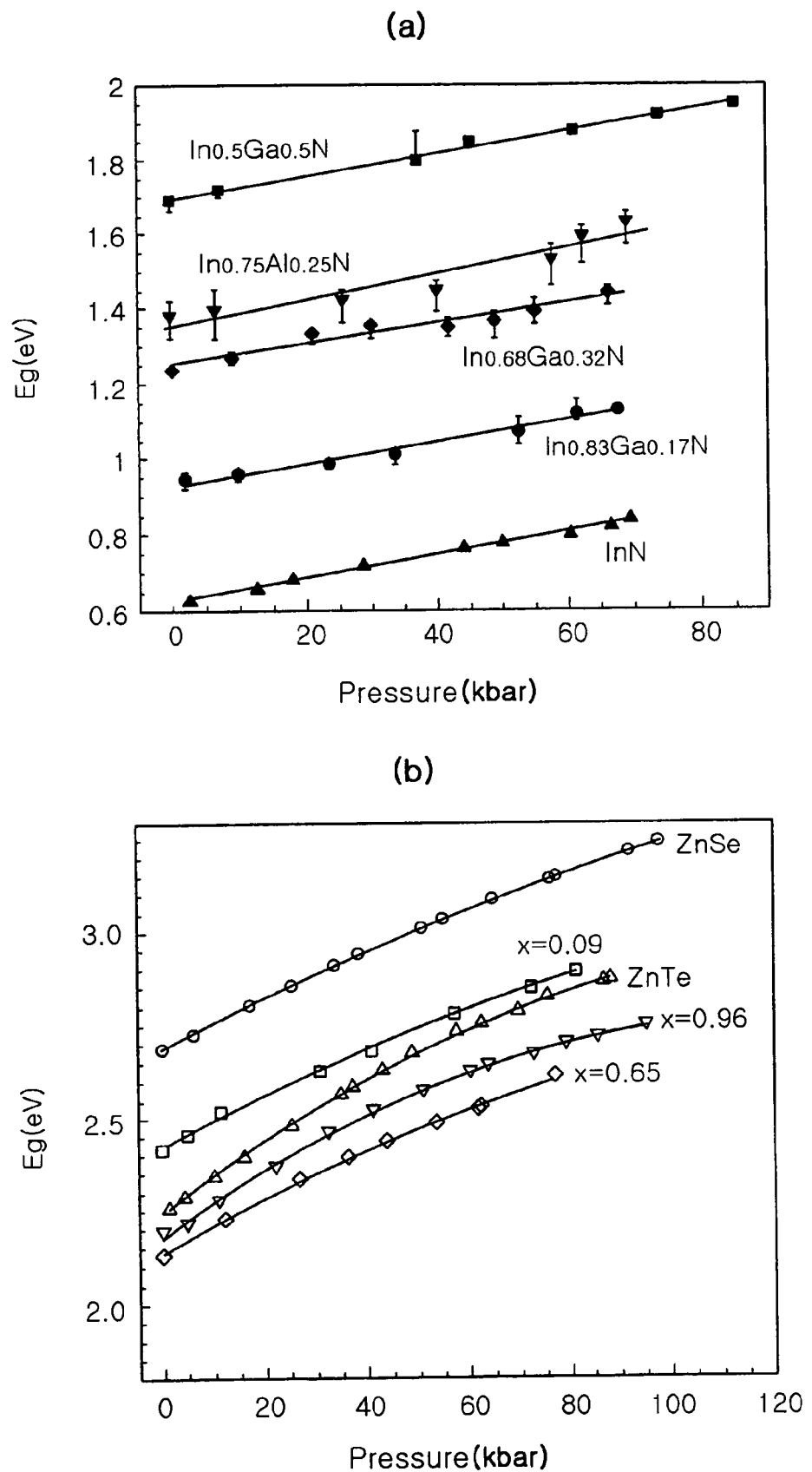
FIGS. 2(a) and 2(b) are diagrams illustrating the principle of wavelength conversion adopted in the present invention, showing changes in the energy band gap according to the pressure of the semiconductor material.

Now, the adjustment principle of the energy band gap via pressure, adopted in the present invention, is explained in more detail, with references to FIGS. 2(a) and 2(b).

FIGS. 2(a) and 2(b) are diagrams illustrating the wavelength-conversion principle adopted in the present invention. Particularly, FIG. 2(a) is a graph showing changes, according to the applied pressure, in the energy band gap of the AlGaInN-based semiconductor material with a particular composition.

FIG. 2(a) illustrates the energy band gaps of InN, $In_{0.583}Ga_{0.17}N$, $In_{0.68}Ga_{0.32}N$, $In_{0.75}Al_{0.25}N$, and $In_{0.5}Ga_{0.5}N$. At the atmospheric pressure, each has the energy band gap of 0.6 eV, 0.95 eV, 1.25 eV, 1.35 eV, and 1.7 eV, respectively. But, when pressure of 70 Kbar (or 80 Kbar) is applied, the energy band gap rises about 0.2 eV. Such high pressure affects the crystal structure to induce change in the lattice constant, thereby changing the energy band gap.

FIG. 2(b) is another graph showing changes in the energy band gaps of ZnSeTe-based semiconductor material according to applied pressure. In FIG. 2b, the semiconductor materials which can be expressed in the composition formula of $ZnSe_{1-x}Te_x$, show changes in the energy band gaps according to the change in pressure, where composition ratios x are 0, 0.09, 0.65, 0.96, and 1. The amount of change varies according to the composition, but on the average, when pressure of 80 Kbar is applied, the energy band gap increases about 0.5 eV.

As shown above, the energy band gap of the semiconductor material has pressure dependence of about 3 to 6 meV/Kbar, in general. Thus, pressure of about 100 Kbar can induce about 100 to 300 nm of wavelength change, achieving variety of colors of visible rays.

In some cases, the pressure dependence may be exhibited such that the energy band gap decreases in accordance with the increase in pressure. But in case of a general semiconductor material, the energy band gap tends to increase according to the increase in pressure. As a result, the wavelength of light emitted from the LED tends to be shortened due to the increase in pressure. Therefore, in order to achieve variety of colors, it is desirable that the LED has light with a wavelength of about 500 nm to about 800 nm when no pressure is applied.

Figure 3:
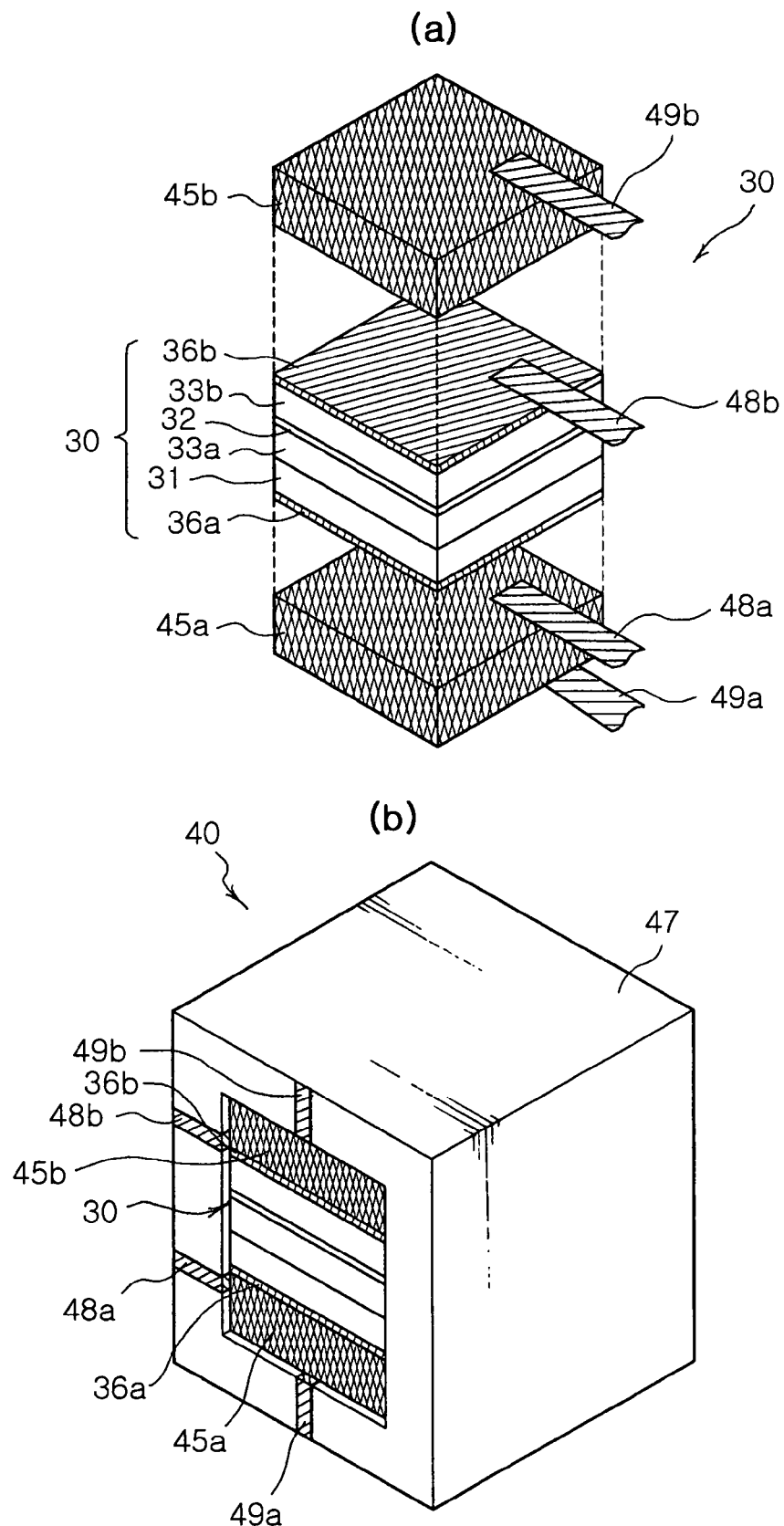
FIG. 3(a) is a partially exploded view and FIG. 3(b) is an overall perspective view of the wavelength-convertible light emitting device according to an embodiment of the present invention.

FIG. 3a is an exploded perspective view of the wavelength-convertible light emitting device having the semiconductor LED, and the first and second piezoelectric layers, with the rigid frame omitted in this view, in order to explain the inner structure of the wavelength-convertible light emitting device in detail. Referring to FIG. 3a, the semiconductor LED 30 adopted in the present invention includes the first conductivity-type cladding layer 33a, the active layer 32, and the second conductivity-type cladding layer 33a and 33b formed in their order on the conductive substrate 31. The semiconductor LED has a rectangular parallelepiped structure in which first and second electrodes 36a and 36b are formed on the underside of the conductive substrate 31 and the upper surface of the second conductivity-type cladding layer 33b, respectively. The LED 30 has to transmit high pressure to the active layer 32, and so it is preferable that the LED 30 has a simple, structurally stable rectangular parallelepiped structure.

The first and second piezoelectric layers 45a and 45b are disposed on the underside of the conductive substrate 31 (especially, the second electrode) and the upper surface of the second conductivity-type cladding layer (especially, the second electrode), respectively.

As shown in FIG. 3(b), the first and second piezoelectric layers 45a and 45b, and the LED 30 interposed therebetween are disposed inside of the rigid frame 47 which is made of substantially non-resilient rigid material. At this time, as shown in FIG. 3(a), the four terminals 48a, 48b, 49a, and 49b are inserted or disposed in appropriate positions, each extending through side walls of the rigid frame 47 to facilitate the connection with the external circuit.

More specifically, the semiconductor LED 30 is connected to a first common terminal 48a connecting the first piezoelectric layer 45a with the conductive substrate 31, and a second common terminal 48b connecting the second piezoelectric layer 45b with the second conductivity-type cladding layer 45b. In addition, the first piezoelectric material driving terminal 49a and the second piezoelectric material driving terminal 49b are connected to the underside of the first piezoelectric layer 45a and the upper surface of the second piezoelectric layer 45b, respectively. Through such structure of terminal pattern, the first and second piezoelectric layers 45a and 45b and the LED 30 are independently driven with different driving voltages.

In the above structure, when high pressure is applied to the first and second piezoelectric layers 45a and 45b via the four terminals, the thickness of the first and second piezoelectric layers 45a and 45b increases, and all the resultant pressure is transmitted as high pressure to the LED 30 by the rigid frame 47. Such pressure may be concentrated on the active area 32, increasing the band gap and inducing the emission of lower wavelength of light than the peculiar wavelength. For example, in case of the active area 32 which is composed of InGaN having 680 nm wavelength light (red), pressure of 100 Kbar can be applied to induce emission of 570 nm wavelength light (yellow).

As mentioned above, as an alternative, at least one piezoelectric layer can be disposed on either one of the surfaces of the LED. In this case, the invention may be adapted to include a common terminal connected to one surface of the piezoelectric layer and one surface of the LED contacting the surface of the piezoelectric layer, a piezoelectric material driving terminal connected to the other surface of the piezoelectric layer, and an LED-driving terminal connected to the other surface of the LED.

As set forth above, the present invention is capable of changing the peculiar wavelength light of a single complete LED according the applied voltage. Also when used in a display device, simple adjustment of applied voltage allows achievement of variety of colors with faster switching speed, without a plurality of LEDs and a complex driving circuit.

While the present invention has been shown and described in connection with the preferred embodiments, it will be apparent to those skilled in the art that modifications and variations can be made without departing from the spirit and scope of the invention as defined by the appended claims.

What is claimed is:

1. A wavelength-convertible light emitting device comprising:
   a semiconductor Light Emitting Diode (LED) having a first and second surfaces opposed to each other, and including first and second conductivity-type cladding layers and an active layer formed between the first and second conductivity-type cladding layers to emit a specific wavelength light;
   at least one piezoelectric layer disposed on at least one of the first and second surfaces of the semiconductor LED, with its thickness variable according to the applied voltage;
   a rigid frame made of substantially non-resilient rigid material, which surrounds the semiconductor LED and the at least one piezoelectric layer such that the increase of the thickness of the piezoelectric layer is applied to the semiconductor LED as pressure; and
   a plurality of terminals formed on the rigid frame, electrically connected to the first and second conductivity-type cladding layers and the piezoelectric layer, respectively.

2. The wavelength-convertible light emitting device according to claim 1, wherein the at least a piezoelectric layer comprises first and second piezoelectric layers each disposed on each of the first and second surfaces of the semiconductor LED, and the plurality of terminals comprise terminals connected to the first and second piezoelectric layers, respectively.

3. The wavelength-convertible light emitting device according to claim 1, wherein the semiconductor LED comprises at least one semiconductor material selected from a group including GaP, GaAs, GaAsP, InGaP, AlGaInP, GaAs, AlGaAs, GaN, InGaN, AlGaN, and AlGaInN.

4. The wavelength-convertible light emitting device according to claim 1, wherein the active layer of the semiconductor LED is adapted to emit wavelength light from about 500 nm to about 800 nm when no pressure is applied from the piezoelectric layers.

5. The wavelength-convertible light emitting device according to claim 4, wherein the maximum pressure applied to the semiconductor LED by the piezoelectric layers is from about 100 Kbar to about 300 Kbar.

6. The wavelength-convertible light emitting device according to claim 1, wherein the semiconductor LED further comprises a conductive substrate with the first conductivity-type cladding layer, the active layer and the second conductivity-type cladding layer formed in their order thereon, and the first and second surfaces of the semiconductor LED are an underside of the conductive substrate and an upper surface of the second conductivity-type cladding layer, respectively.

7. The wavelength-convertible light emitting device according to claim 6, wherein the plurality of terminals include a common terminal connected to a surface of the piezoelectric layer and to either one of the first and second surfaces of the semiconductor LED in contact with the piezoelectric layer, a piezoelectric layer driving terminal connected to the other surface of the piezoelectric layer, and an LED-driving terminal connected to the other one of the first and second surfaces of the semiconductor LED.

8. The wavelength-convertible light emitting device according to claim 6, wherein the at least a piezoelectric layer comprises first and second piezoelectric layers disposed on the first and second surfaces of the semiconductor LED, respectively, and the plurality of terminals comprise a first piezoelectric material driving terminal connected to an underside of the first piezoelectric layer, a second piezoelectric material driving terminal connected to an upper surface of the second piezoelectric layer, a first common terminal connecting the conductive substrate with the first piezoelectric layer, and a second common terminal connecting the second conductivity-type cladding layer with the second piezoelectric material.

9. The wavelength-convertible light emitting device according to claim 1, wherein the rigid frame has at least one side opened up to expose a side of the active layer of the LED.

10. The wavelength-convertible light emitting device according to claim 1, wherein the rigid frame is made of transparent material.

* * * * *